United States Patent
Liu et al.

(10) Patent No.: US 12,329,010 B1
(45) Date of Patent: Jun. 10, 2025

(54) DISPLAY PANELS AND DISPLAY DEVICES

(71) Applicant: KUNSHAN GO-VISIONOX OPTO-ELECTRONICS CO., LTD., Kunshan (CN)

(72) Inventors: Mingxing Liu, Kunshan (CN); Yu Wang, Kunshan (CN); Tian Ma, Kunshan (CN); Dong Zhao, Kunshan (CN); Jing Shao, Kunshan (CN); Yang Shao, Kunshan (CN); Chao Chi Peng, Kunshan (CN); Junfeng Li, Kunshan (CN)

(73) Assignee: KUNSHAN GO-VISIONOX OPTO-ELECTRONICS CO., LTD. (CN)

( * ) Notice: Subject to any disclaimer, the term of this patent is extended or adjusted under 35 U.S.C. 154(b) by 473 days.

(21) Appl. No.: 17/972,277

(22) Filed: Oct. 24, 2022

Related U.S. Application Data

(63) Continuation of application No. PCT/CN2021/088867, filed on Apr. 22, 2021.

(30) Foreign Application Priority Data

Jul. 1, 2020 (CN) .......................... 202010622121.5

(51) Int. Cl.
*H10K 59/35* (2023.01)

(52) U.S. Cl.
CPC ......... *H10K 59/353* (2023.02); *H10K 59/351* (2023.02)

(58) Field of Classification Search
CPC ... H10K 59/35–353; G09G 2300/0443; G09G 2300/0452
See application file for complete search history.

(56) References Cited

U.S. PATENT DOCUMENTS

2015/0108455 A1 4/2015 Jung
2019/0252469 A1* 8/2019 Xiao .................... G09G 3/3225
(Continued)

FOREIGN PATENT DOCUMENTS

CN 104465714 A * 3/2015 .......... G09G 3/2003
CN 104576690 A 4/2015
(Continued)

OTHER PUBLICATIONS

International Search Report and Written Opinion (International Application No. PCT/CN2021/088867) with English Translation, dated Jul. 27, 2021, 14 pages.
(Continued)

*Primary Examiner* — Mariceli Santiago
(74) *Attorney, Agent, or Firm* — Quarles & Brady LLP

(57) ABSTRACT

A display panel comprises a plurality of sub-pixels and a plurality of light-transmitting reserved regions. The plurality of sub-pixels include a plurality of first sub-pixels, a plurality of second sub-pixels, and a plurality of third sub-pixels, one of the second sub-pixels and one of the light-transmitting reserved regions are adjacently arranged to form a combined region. A plurality of first sub-pixels and a plurality of combined regions are arranged in each first pixel row, and a plurality of third sub-pixels are arranged in each second pixel row. In two adjacent first pixel rows, a pixel arrangement of the combined region located in one first pixel row and another pixel arrangement of the combined region located in the other first pixel row are different, and have the same structures if one of the two combined regions is rotated by 90 degrees.

20 Claims, 7 Drawing Sheets

(56) References Cited

U.S. PATENT DOCUMENTS

2020/0203445 A1    6/2020  Ou et al.
2020/0402442 A1*  12/2020  Liu .................... H10K 59/353
2021/0384270 A1   12/2021  Liu et al.
2022/0208891 A1    6/2022  Liu et al.

FOREIGN PATENT DOCUMENTS

| CN | 109638035 A | * | 4/2019 | ........... G09G 3/3225 |
| CN | 109860237 A | | 6/2019 | |
| CN | 110323259 A | | 10/2019 | |
| CN | 210073853 U | | 2/2020 | |
| CN | 111341817 A | | 6/2020 | |
| CN | 111799320 A | * | 10/2020 | ........... G06F 3/0446 |
| CN | 112436032 A | | 3/2021 | |
| WO | WO-2019153938 A1 | * | 8/2019 | ........... G02F 1/1333 |

OTHER PUBLICATIONS

Chinese Search Result (CN Application No. 202010622121.5) with English Translation, dated Sep. 5, 2022, 4 pages.

* cited by examiner

DISPLAY PANELS AND DISPLAY DEVICES

CROSS-REFERENCES TO RELATED APPLICATIONS

This application is a continue application for International Application PCT/CN2021/088867, filed on Apr. 22, 2021, which claims priority to Chinese Patent Application No. 2020106221215, entitled "DISPLAY PANEL AND DISPLAY DEVICE" and filed with the Chinese Patent Office on Jul. 1, 2020. The entire contents of both applications are incorporated herein by reference.

TECHNICAL FIELD

The present application relates to the field of display technologies, and in particular, to a display panel and a display device.

BACKGROUND

With continuous development of a display technology, people have higher and higher requirements for resolution of display panels. Due to advantages such as high quality of display, high-resolution display panels are increasingly widely used. Generally, resolution of a display device may be improved by reducing sizes of sub-pixels and pitches between sub-pixels. However, the reduction in the sizes of the sub-pixels and the pitches between the sub-pixels is also accompanied with higher and higher requirements on accuracy of a manufacturing process, leading to an increase in difficulty of the manufacturing process and manufacturing costs of the display device.

SUMMARY

Based on the above, there is a need to provide a display panel and a display device, so as to improve light transmittance of the display panel.

According to one aspect of the present application, a display panel is provided, wherein the display panel includes a plurality of sub-pixels and a plurality of light-transmitting reserved regions, the plurality of sub-pixels including a plurality of first sub-pixels, a plurality of second sub-pixels, and a plurality of third sub-pixels, wherein one of the second sub-pixels and one of the light-transmitting reserved regions are adjacently arranged to form a combined region;

the display panel includes a plurality of first pixel rows and a plurality of second pixel rows, the first pixel rows and the second pixel rows being alternately arranged; a plurality of first sub-pixels and a plurality of combined regions are arranged in each of the first pixel rows, the first sub-pixels and the combined regions are alternately arranged in the first pixel row, and a plurality of third sub-pixels are arranged in each of the second pixel rows; wherein, in two adjacent first pixel rows, a pixel arrangement of a combined region located in one first pixel row and another pixel arrangement of a combined region located in another first pixel row are different, and have the same structures if one of the two combined regions is rotated by 90 degrees.

In the present application, the light-transmitting reserved region and the second sub-pixel form a combined region, and a structure of the combined region in a front arrangement structure is adjusted to break the conventional arrangement, so as to realize irregular arrangement of the second sub-pixel and the light-transmitting reserved region in different rows/columns, which is beneficial to ameliorate a color edge phenomenon and improve the light transmittance of the display panel while realizing a high resolution.

In an embodiment, the first sub-pixels located in the two adjacent first pixel rows are offset along an extension direction of the first pixel row.

In an embodiment, two first sub-pixels respectively located in different first pixel rows and adjacent to each other are arranged in a first direction or a second direction.

In an embodiment, each of the third sub-pixels is arranged between two first sub-pixels in the first direction or the second direction;

wherein the first direction and the second direction are perpendicular to each other and intersect with the extension directions of the first pixel rows, respectively.

In an embodiment, centers of the first sub-pixels and centers of the second sub-pixels in a same first pixel row are not on a same straight line.

In an embodiment, the centers of the first sub-pixels in the same first pixel row are located on a first straight line, the centers of the second sub-pixels in the first same pixel row are located on a second straight line, and the first straight line and the second straight line are not collinear with each other.

In an embodiment, the first straight line is parallel to the second straight line.

In an embodiment, centers of the third sub-pixels in a same second pixel row are not on a same straight line.

In an embodiment, a line of the centers of the third sub-pixels in the same second pixel row has a regular wavy shape.

In an embodiment, the second sub-pixels and the third sub-pixels are regular graphics or irregular graphics with major axes and minor axes;

in an embodiment, major-axis directions of the second sub-pixels are parallel to the first direction or the second direction; and/or in an embodiment, major-axis directions of the third sub-pixels are parallel to the first direction or the second direction.

In an embodiment, the first sub-pixels have first edges parallel to the first direction and second edges parallel to the second direction; preferably, the first sub-pixels are in a shape of a diamond or square.

In an embodiment, the second sub-pixels and the third sub-pixels are in a shape of a rectangle or quasi-rectangle.

In an embodiment, along the first direction, second sub-pixels whose major-axis directions are parallel to the first direction and third sub-pixels whose major-axis directions are parallel to the first direction are not in a same row; and in an embodiment, along the second direction, second sub-pixels whose major-axis directions are parallel to the second direction and third sub-pixels whose major-axis directions are parallel to the second direction are not in a same row.

In an embodiment, along the first direction, second sub-pixels whose major-axis directions are parallel to the first direction and any of the first sub-pixels are not in a same row; and in an embodiment, along the second direction, second sub-pixels whose major-axis directions are parallel to the second direction and any of the first sub-pixels are not in a same row.

In an embodiment, any two adjacent third sub-pixels have different major-axis directions in a same second pixel row.

In an embodiment, a line of centers of four adjacent third sub-pixels forms a virtual quadrilateral, and a minimum inner angle of the virtual quadrilateral is greater than 60° and less than 90°.

In an embodiment, along the first direction or the second direction, center points of the first sub-pixels arranged in a same direction are not on a same straight line.

In an embodiment, the third sub-pixels are regular graphics or irregular graphics with major axes and minor axes; and each of the third sub-pixels has two first sub-pixels along two sides of its major-axis direction or along two sides of its minor-axis direction, wherein, when the two first sub-pixels are located on the two sides of the major-axis direction of the third sub-pixel, a pitch therebetween is d1; and when the two first sub-pixels are located on the two sides of the minor-axis direction of the third sub-pixel, a pitch therebetween is d2, wherein d1 is greater than d2.

In an embodiment, the pixel arrangement structure includes a plurality of first pixel units and a plurality of second pixel units, the first pixel units and the second pixel units are alternately arranged in the first direction or the second direction, and a mirror structure of the second pixel units rotating by 90 degrees as a whole is the same as that of the first pixel units;

wherein the first pixel unit or the second pixel unit includes one of the first sub-pixels, two of the second sub-pixels, and one of the combined regions; wherein along the first direction or the second direction, the first sub-pixel and one of the third sub-pixels are in a same row, and another third sub-pixel and the combined region are in another row.

In an embodiment, in the other row, the second sub-pixel is located between the other third sub-pixel and the light-transmitting reserved region.

In an embodiment, the second sub-pixels and the third sub-pixels have same major-axis directions in a same pixel unit.

According to another aspect of the present application, a display device is provided, including the display panel described in the above embodiment.

DETAILED DESCRIPTION OF THE EMBODIMENTS

Figure 1:
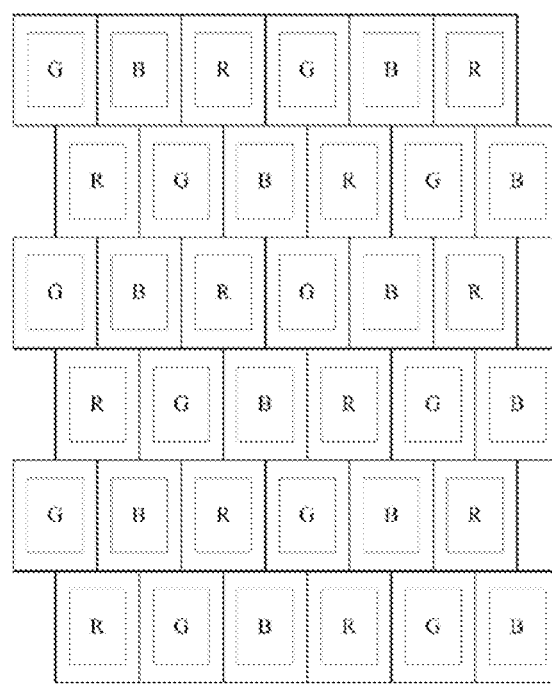
FIG. 1 is a schematic diagram of pixel arrangement.

A Sup-Pixel Rendering (SPR) technology may make use of differences of resolution of sub-pixels in different colors by human eyes to change a conventional mode of defining a pixel simply by red, green and blue sub-pixels, and simulate and realize a performance capability of a same pixel resolution by using a relatively small number of sub-pixels by sharing certain sub-pixels in colors insensitive to position resolution between different pixels, so as to reduce the difficulty in the manufacturing process and decrease the manufacturing costs.

In addition, it is also increasingly extensive to arrange a photosensitive device in an under-screen display region. For example, a fingerprint recognition device is arranged in the under-screen display region. The photosensitive device for acquiring a fingerprint image may include an optical sensor. The optical sensor may include a plurality of pixel points. The plurality of pixel points may respectively receive light signals reflected from different positions of an object and convert incident light into electrical signals, so as to generate an image of the object. Therefore, an amount of light input and contrast of the light signals received by the pixel points may both affect the quality of the generated image of the object. In this way, certain requirements are also put forward for light transmittance of the display panel, which further increases the difficulty in the design of a pixel arrangement structure.

To facilitate understanding of the present application, a more comprehensive description of the present application will be given below with reference to the relevant accompanying drawings. Preferred embodiments of the present application are given in the drawings. However, the present application may be implemented in many different forms and is not limited to the embodiments described herein. Rather, these embodiments are provided to make the contents disclosed in the present application more fully understood.

It is to be understood that, although the terms such as "first" and "second" may be used herein to describe various elements, they do not indicate any order, quantity, or importance but merely distinguish different components. These terms are used only to distinguish one element from another element. For example, without departing from the scope of the present application, the first element may be referred to as the second element, and similarly, the second element may be referred to as the first element. "Comprise" or "include" and other similar words mean that an element or thing appearing before the word covers elements or things listed after the word and equivalents thereof, without excluding other elements or things.

Unless defined otherwise, all technical and scientific terms used herein have the same meanings as would generally understood by those skilled in the technical field of the present application. The terms used herein in the specification of the present application are for the purpose of describing specific embodiments only, and are not intended to limit the present application. The term "and/or" used herein includes any and all combinations of one or more related listed items.

An organic light-emitting diode (OLED) display panel is current-driven, and a pixel driving circuit is required to connect an OLED device to provide a driving current for the OLED device to emit light. The OLED device includes at least an anode, a cathode, and an organic light-emitting material located between the anode and cathode. For example, in a top-emission type OLED display panel, the organic light-emitting material, due to poor stability, cannot be patterned through a conventional etching process, and thus a vapor deposition process with a mask is used instead. The organic light-emitting material is placed in a vacuum environment, and is evaporated or sublimated by heating. A mask is arranged between a cavity for evaporating the organic material and a to-be-vapor-deposited array substrate. The mask is provided with openings corresponding to regions requiring vapor deposition, while regions not requiring vapor deposition have no openings. The evaporated or sublimated organic material molecules are attached to the to-be-vapor-deposited array substrate through the openings, thereby directly forming a patterned organic material layer. The mask configured to correspondingly vapor-deposit light-emitting material layers of sub-pixels is a fine metal mask (FMM), also called a fine mask. Due to limitations in sizes of the openings of the fine mask, sizes of distances between the openings, and net-tension difficulties, it is difficult to further improve pixel per inch (referred as PPI hereinafter) of the organic light-emitting display panel with the pixel arrangement in the prior art.

In order to solve the above problem, the resolution of the display panel may be improved by using an SPR technology. As shown in FIG. 1, a non-rendered pixel includes three sub-pixels, while a rendered pixel includes only two sub-pixels. Therefore, the number of pixels can be increased by 50% while the sub-pixels remain unchanged, thereby improving the resolution. However, in the SPR technology, each pixel includes only two sub-pixels, which, in order to achieve full color display, is required to borrow colors that cannot be displayed from neighboring sub-pixels. Therefore, in the case of display is performed by this pixel arrangement structure, a color edge may appear at an edge of a screen due to differences in numbers of sub-pixels in various colors in a row direction and/or a column direction, or different protrusion degrees of sub-pixels at display edges, thereby affecting the quality of display.

At the same time, to enable the display panel to have a better light-emitting effect, the arrangement of the sub-pixels is expected to be more uniform, and adjacent pixels in a same color are designed to share a mask opening, so as to increase an opening area of the mask and reduce the difficulty of alignment. However, in the case of display by the display panel with this pixel arrangement structure, it may be difficult for human eyes to distinguish the adjacent pixels in the same color, which results in visual integration of the two pixels in the same color, thereby producing a sense of granularity and affecting the quality of display.

In addition, to enable a terminal device to implement more functions, it is also increasingly extensive to arrange a photosensitive device in an under-screen display region. For example, a fingerprint recognition device is arranged in the under-screen display region. The photosensitive device for acquiring a fingerprint image may include an optical sensor. The optical sensor may include a plurality of pixel points. The plurality of pixel points may respectively receive light signals reflected from different positions of an object and convert incident light into electrical signals, so as to generate an image of the object. Therefore, an amount of light input and contrast of the light signals received by the pixel points may both affect the quality of the generated image of the object. In this way, certain requirements are also put forward for light transmittance of the display panel, which further increases the difficulty in the design of the pixel arrangement structure.

In order to solve at least one of the above problems, the present application provides a display panel and a display device, which can better alleviate the above problems.

Figure 2:
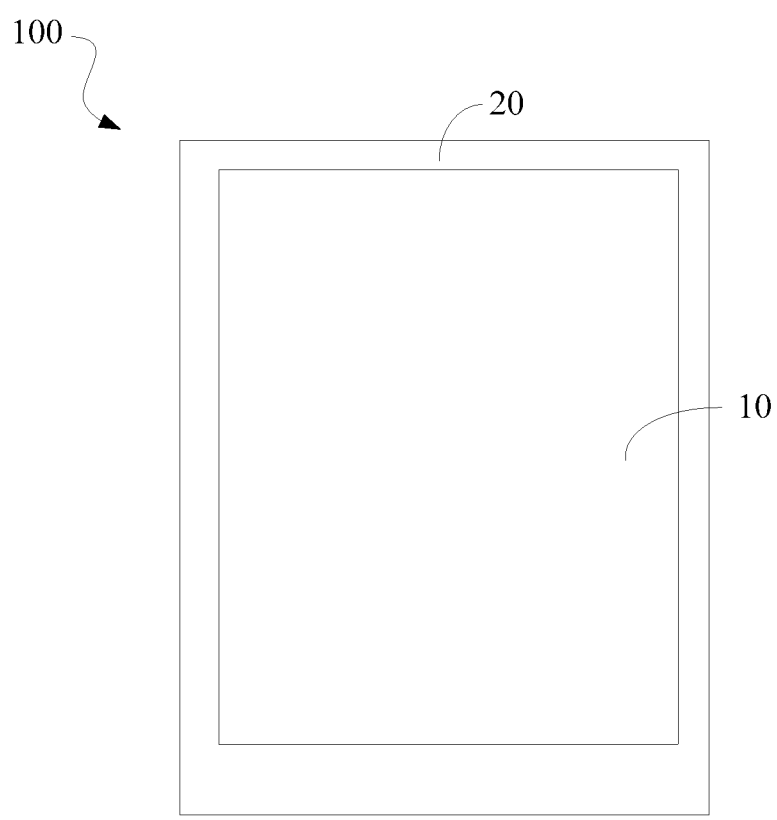
FIG. 2 is a structural schematic diagram of a display panel according to an embodiment of the present application.

FIG. 2 is a structural schematic diagram of a display panel according to an embodiment of the present application.

Referring to the drawing, a display panel 100 according to an embodiment of the present application includes a display region 10 and a non-display region 20. The display region 10 displays an image through a plurality of sub-pixels. Specific to some embodiments, the display region 10 may be in the shape of a rectangle, and the non-display region 20 is arranged around the display region 10. Certainly, shapes and arrangement of the display region 10 and the non-display region 20 include, but are not limited to, the above example. For example, when the display panel 100 is configured for a wearable device worn on a user, the display region 10 may have a circular shape like a watch. When a display substrate is configured for display on a vehicle, the display region 10 and the non-display region 20 may take a shape of a circle, a polygon, or other shapes. The display region 10 is provided with a plurality of sub-pixels that emit light in different colors, and the sub-pixels are represented as a minimum unit configured to emit light (for example, a minimum addressable unit of the display panel 100).

Figure 3:
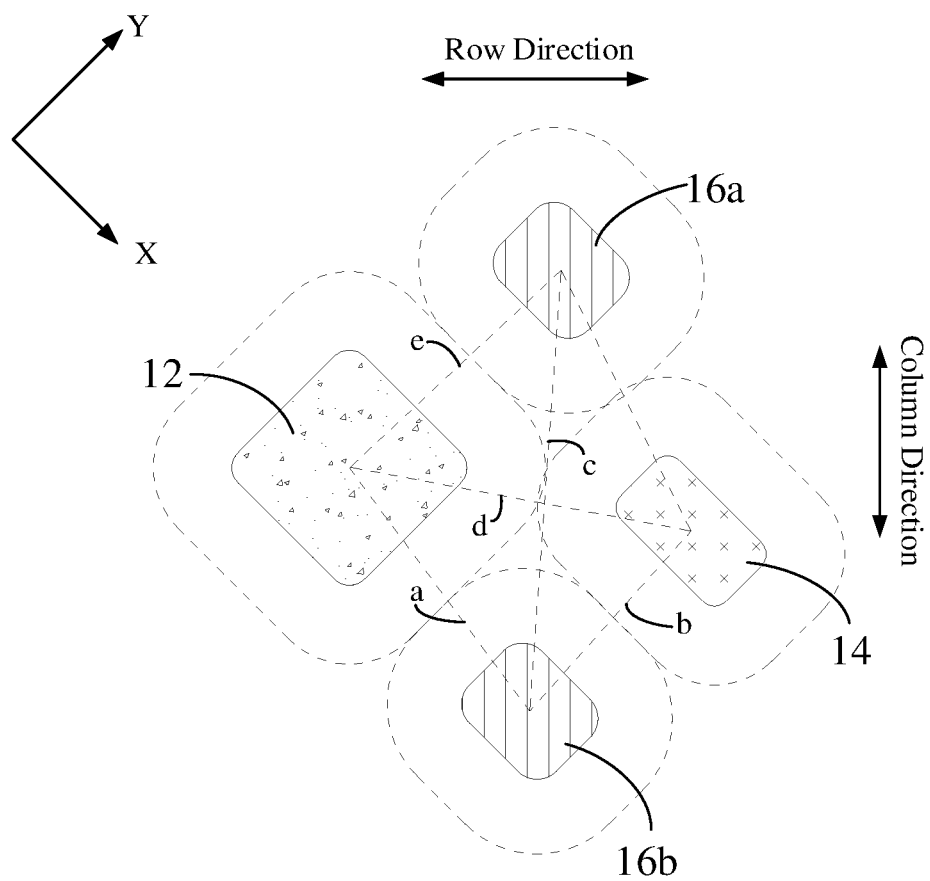
FIG. 3 is a schematic diagram of arrangement of a first pixel unit according to an embodiment of the present application.
Figure 4:
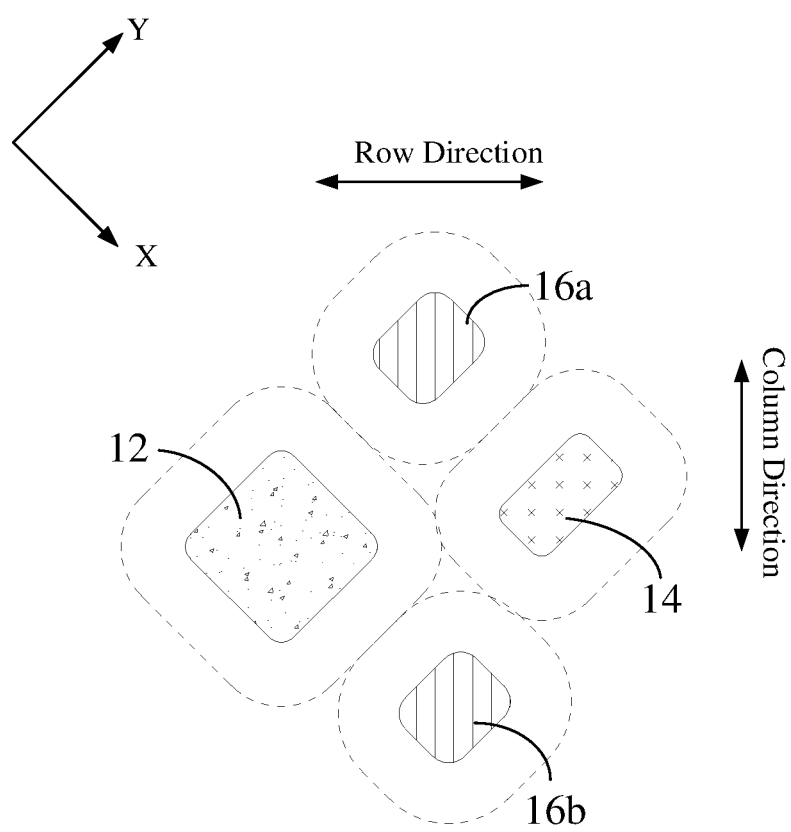
FIG. 4 is a schematic diagram of arrangement of a second pixel unit according to an embodiment of the present application.
Figure 5:
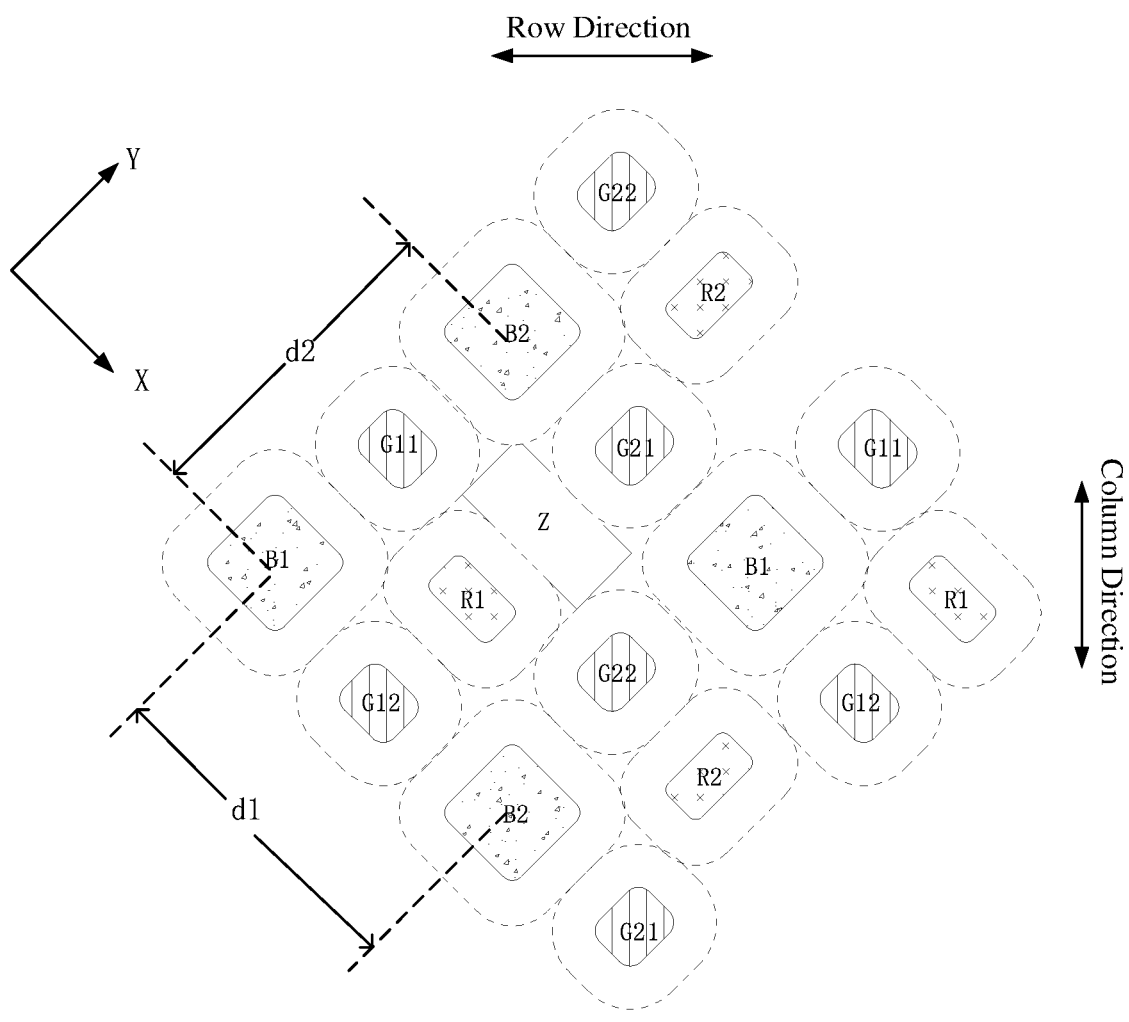
FIG. 5 is a schematic diagram of pixel arrangement of a display matrix according to an embodiment of the present application.
Figure 6:
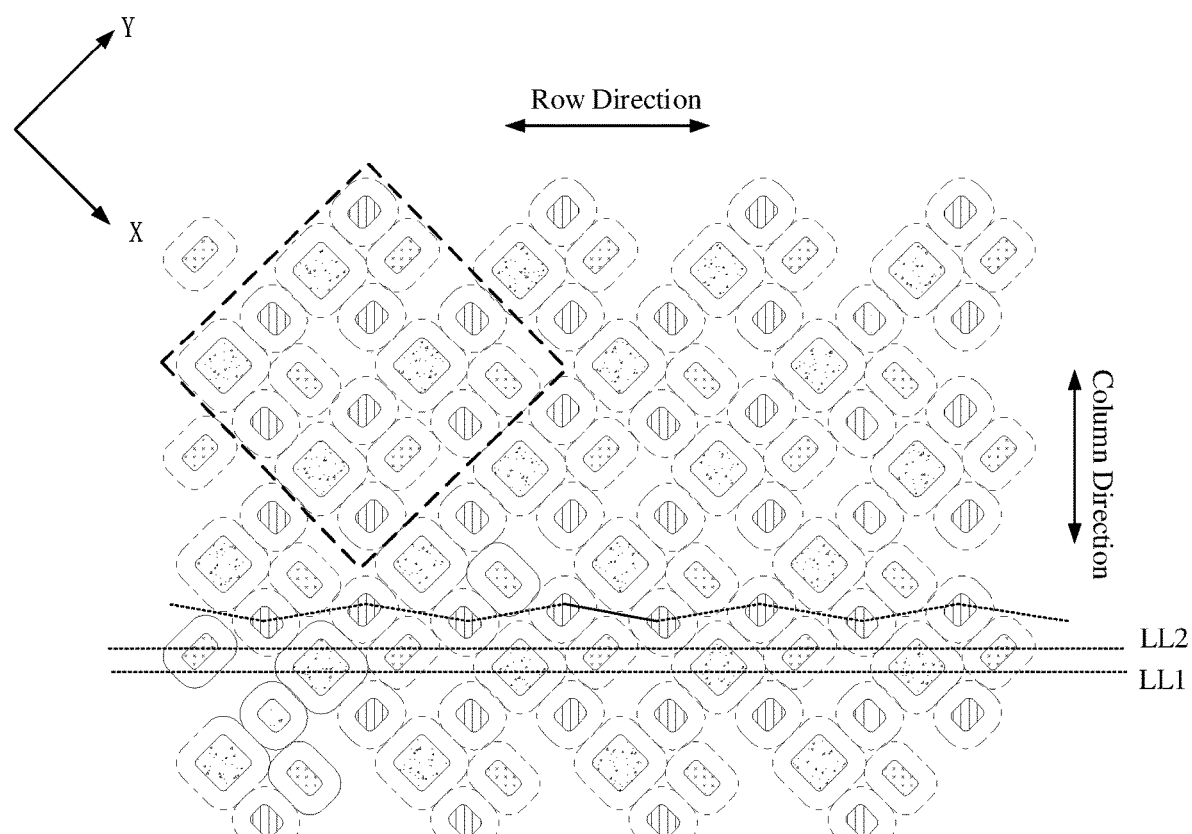
FIG. 6 is a schematic diagram of arrangement of repetitive units according to an embodiment of the present application.
Figure 7:
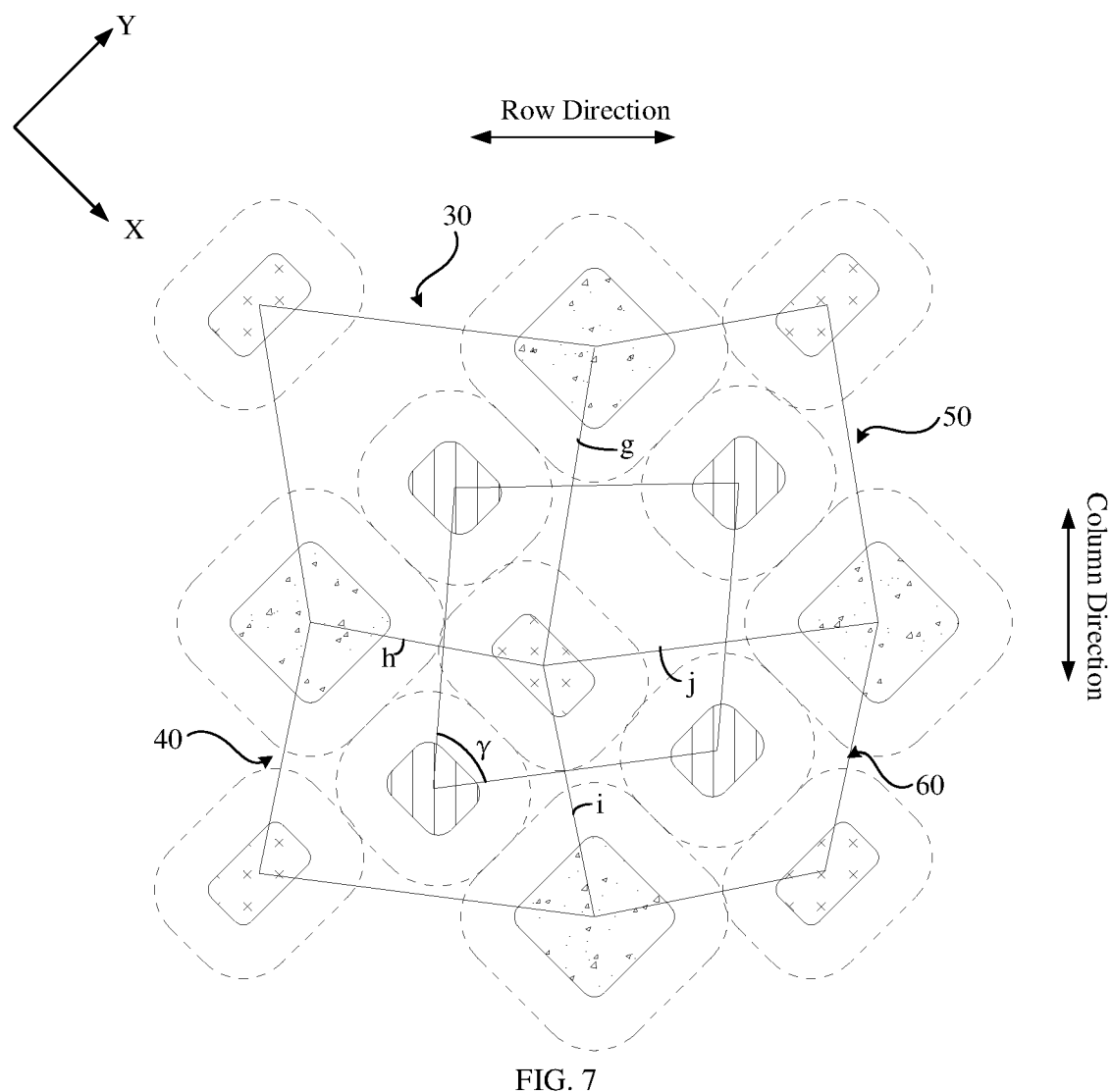
FIG. 7 is a schematic diagram of a partial structure of a pixel arrangement structure according to an embodiment of the present application.

FIG. 3 is a schematic diagram of arrangement of a first pixel unit according to an embodiment of the present application; FIG. 4 is a schematic diagram of arrangement of a second pixel unit according to an embodiment of the present application; FIG. 5 is a schematic diagram of pixel arrangement of repetitive units according to an embodiment of the present application;

FIG. 6 is a schematic diagram of arrangement of a display matrix according to another embodiment of the present application; and FIG. 7 is a schematic diagram of partial arrangement of a pixel arrangement structure according to another embodiment of the present application.

A display panel according to at least one embodiment of the present application includes a plurality of sub-pixels and a plurality of light-transmitting reserved regions. The plurality of sub-pixels include a plurality of first sub-pixels 12, a plurality of second sub-pixels 14, and a plurality of third sub-pixels 16a and 16b. The first sub-pixels 12, the second sub-pixels 14, and the third sub-pixels 16a and 16b may be one of blue light-emitting sub-pixels, red light-emitting sub-pixels and green light-emitting sub-pixels, respectively. It is to be understood that light in different colors has different wavelengths. The longer the wavelength is, the higher the energy of light is. High-energy light easily causes the decay of the organic light-emitting material, so that sub-pixels that emit high-energy photons decay more easily. It is well known that blue light has a shorter wavelength than red light and green light, so the blue light has higher energy, and the organic light-emitting materials that emit blue light are more prone to decay. As a result, light emitted from the pixel unit tends to be reddish, resulting in white light color cast. Moreover, light emitted by each sub-pixel is repeatedly reflected and re-reflected between an anode and a cathode through a micro-cavity effect for amplification and constructive interference. The brightness of the light is increased, and the color cast is further amplified. As a preferred implementation, the blue sub-pixel has a larger light-emitting area than the red sub-pixel and the blue sub-pixel. In this way, poor display caused by different decay rates of organic light-emitting materials emitting light in different colors can be reduced to some extent. It is to be noted that, in some implementations, the blue sub-pixel may have a same light-emitting area as the red sub-pixel. However, since the human eyes are more sensitive to the green light than the red light, in some other implementations, the light-emitting area of the green sub-pixel may be smaller than that of the red sub-pixel, which is not limited herein.

The display panel includes a plurality of first pixel rows and a plurality of second pixel rows, and the first pixel rows and the second pixel rows being alternately arranged; a plurality of first sub-pixels and a plurality of combined regions are arranged in each of the first pixel rows, and the combined region includes one of the second sub-pixels and one of the light-transmitting reserved regions adjacently arranged. The first sub-pixels and the combined regions are alternately arranged in the first pixel row, and a plurality of third sub-pixels are arranged in each of the second pixel rows; in two adjacent first pixel rows, a pixel arrangement of the combined region located in one first pixel row and another pixel arrangement of the combined region located in the other first pixel row are different, and have the same structures if one of the two combined regions is rotated by 90 degrees. For example, as shown in FIG. 5 and FIG. 6, the first sub-pixels are blue sub-pixels, the second sub-pixels are red sub-pixels, and the third sub-pixels are green sub-pixels. With reference to a row direction, odd-numbered rows are the first pixel rows, and even-numbered rows are the second pixel rows. The odd-numbered rows, that is, the first pixel rows, each include a plurality of first sub-pixels and a plurality of combined regions (including the second sub-pixels and the light-transmitting reserved regions). The first sub-pixels and the combined regions are alternately arranged in the first pixel row. In the first pixel row, any two adjacent first sub-pixels are separated by one of the combined regions, and any two adjacent combined regions are separated by one of the first sub-pixels.

In two adjacent first pixel rows, the combined region located in one first pixel row and the combined region located in the other first pixel row are different in arrangement structure, and the two combined regions have the same structures after rotating any one of the two combined regions by 90 degrees. For example, still referring to FIG. 5 and FIG. 6, the combined region in one first pixel row includes a second sub-pixel R1 and a light-transmitting reserved region Z, and the combined region in the other adjacent first pixel row includes a second sub-pixel R2 and a light-transmitting reserved region Z. Pixel arrangements of the combined region including a second sub-pixel R1 and a light-transmitting reserved region Z and the combined region including a second sub-pixel R2 and a light-transmitting reserved region Z are different, and have the same structures if one of the two combined regions is rotated by 90 degrees. The even-numbered rows, that is, the second pixel rows, include a plurality of third sub-pixels.

In particular, in some embodiments, extension directions of the first pixel rows may be parallel to a horizontal row direction or a vertical column direction. In some other embodiments, the extension directions of the first pixel rows may also be directions intersecting with the horizontal row direction and the vertical column direction.

In particular, the light-transmitting reserved region is a region allowing light to pass through. In the present application, the arrangement of arranging the second sub-pixels and the light-transmitting reserved regions after combining the two helps to improve an amount of light input of light signals received by the under-screen photosensitive device without affecting the display effect.

In an embodiment, the first sub-pixels located in the two adjacent first pixel rows are offset along an extension direction of the first pixel row. For example, as shown in FIG. 5 and FIG. 6, one first pixel row includes a plurality of first sub-pixels B1, and the other first pixel row includes a plurality of first sub-pixels B2. The first sub-pixels B1 and the first sub-pixels B2 are offset. That is, the first sub-pixels B1 and the first sub-pixels B2 are not on a same column. In the specific embodiments shown in FIG. 5 and FIG. 6, two first sub-pixels respectively located in different first pixel rows and adjacent to each other are arranged in a first direction or a second direction. Still referring to FIG. 5 and FIG. 6, with reference to a row direction, the first sub-pixel B1 is adjacent to two first sub-pixels B2 in adjacent rows. One of the first sub-pixels B2 and the first sub-pixel B1 adjacent thereto are arranged in the first direction X. The other of the first sub-pixels B2 and the first sub-pixel B1 adjacent thereto are arranged in the second direction Y. The first direction and the second direction are perpendicular to each other and intersect with the extension directions of the first pixel rows, respectively. Specifically, in the embodiment shown in FIG. 5, the first pixel row direction is the horizontal left-right direction as illustrated, and the vertical up-down direction as illustrated is the column direction. In this case, the first direction X and the second direction Y are directions obliquely intersecting at an angle with respect to a horizontal direction and a vertical direction.

In an embodiment, each of the third sub-pixels is arranged between two of the first sub-pixels in the first direction or the second direction. For example, as shown in FIG. 5 and FIG. 6, two first sub-pixels B1 and B2 are arrange on two sides of any third sub-pixel G11, G12, G21 or G22 arranged in the first direction or the second direction.

In an embodiment, along the first direction and the second direction, one third sub-pixel is arranged between any two first sub-pixels; a combined region is arranged between four third sub-pixels adjacently arranged, and the combined region includes a second sub-pixel and a light-transmitting reserved region adjacently arranged.

It may be understood that the pixel arrangement structure directly determines the display effect. In order to ensure the uniformity of display, the sub-pixels may generally be arranged as evenly as possible along the row direction and the column direction according to certain rules, but the existing pixel arrangement structure is also prone to a color edge and a sense of visual granularity. The pixel arrangement structure may take into account the arrangement uniformity, compactness and pitches between the sub-pixels to seek a balance among the three, which is conducive to reducing the color mixing risk and ameliorating the color edge and the sense of visual granularity. For example, when the display matrix is formed, the sub-pixels are arranged in a staggered manner due to the above restrictions, so as to prevent arrangement of the sub-pixels emitting light in a same color into an individual row, which ameliorates the color edge problem of the display edge. Moreover, the staggered sub-pixels enable the sub-pixels at a rounded corner of the display panel to better match the rounded corner design. That is, smooth transition of a line of edges of the sub-pixels at the rounded corner is tangent to or consistent with a radian of the rounded corner, so as to alleviate the problem of serration at the rounded corner. In addition, with the pixel arrangement structure, a distance between sub-pixels in a same color in a same pixel unit may be appropriately enlarged. For example, a distance between the third sub-pixels 16a and 16b, to which the human eyes are sensitive, is appropriately enlarged, and the first sub-pixel 12 and the second sub-pixel 14 are arranged to be close to each other, so as to prevent the sense of granularity of display caused by identification as one due to impossible distinction of the sub-pixels to which the human eyes are sensitive.

It is also worth emphasizing that an amount of light input and contrast of light signals received by the under-screen photosensitive device may affect the quality of the generated image of the object. Although the display panel with other pixel arrangement structures has more light-transmitting regions so that an overall light-transmitting area has no difference, a continuous light-transmitting region in a specific region has a small area, which cannot meet the light transmittance required by the normal operation of the under-screen photosensitive device. With the above restrictions of pixel arrangement, a combined region is arranged between four third sub-pixels G11, G12, G13 and G14 adjacently arranged, and a light-transmitting reserved region is arranged in the combined region, which is conducive to the realization of the manufacturing of a display screen such as an under-screen camera.

In an example, the pixel arrangement structure includes a plurality of first pixel units and a plurality of second pixel units. The first pixel units and the second pixel units are adjacent to each other, and the plurality of first pixel units and the plurality of second pixel units are arranged alternately in the first direction and the second direction. For example, as shown in FIG. 5 and FIG. 6, in the first direction X, the first pixel units and the second pixel units are alternately arranged, and in the second direction Y, the first pixel units and the second pixel units are alternately arranged. That is, in the first direction and the second direction, any two adjacent first pixel units are separated by a second pixel unit, and any two adjacent second pixel units are separated by a first pixel unit. As a preferred implementation, as shown in FIG. 5 and FIG. 6, an angle between the first direction and the row direction is 45°, and the second direction is perpendicular to the first direction and has an angle of 45° to the column direction.

Further, as shown in FIG. 3 and FIG. 4, one pixel unit includes one first sub-pixel 12, two third sub-pixels 16a and 16b and one of the above-mentioned combined regions. The above-mentioned combined region includes a second sub-pixel 14 and a light-transmitting reserved region. Along the first direction or the second direction, the first sub-pixel 12 and one third sub-pixel 16a are in a same row, and the other third sub-pixel 16b and the combined region are in another row. For example, in the embodiment shown in FIG. 5, in one first pixel unit, the first sub-pixel B1 and one third sub-pixel G11 are in a same row along the first direction, and the other third sub-pixel G12 and the above-mentioned combined region are in another row. Correspondingly, in one second pixel unit, the first sub-pixel B2 and one third sub-pixel G21 are in a same row in the second direction, and the other third sub-pixel G22 and the combined region are in another row along the second direction. Preferably, in the another row, the second sub-pixel R1/R2 is located between the other third sub-pixel G12/G22 and the light-transmitting reserved region. In this way, the sub-pixels in the pixel units are arranged compactly and uniformly, which is beneficial to improve the display effect.

In particular, the second pixel units rotate by a predetermined angle as a whole and then form mirror symmetry with sub-pixel structures as the first pixel units. That is, the sub-pixels in the first pixel units and the sub-pixels in the same color in the second pixel units are the same in shape and size (light-emitting area). A sub-pixel structure formed by rotating a sub-pixel structure of the second pixel units clockwise or counterclockwise by a predetermined angle as a whole form mirror symmetry with the structure in the first pixel units. The predetermined angle is greater than 0° and less than 360°. For example, the second pixel units shown in FIG. 4 rotate by 90° as a whole and then form, along the first direction, mirror symmetry with the structure of the first pixel units shown in FIG. 3. In this way, arrangement of the sub-pixels emitting the light in the same color into an individual row in the row direction or the column direction is prevented, and protrusion degrees of the sub-pixels in the same row or column are weakened, and the color edge problem of the display edge is further ameliorated. At the same time, the color cast may also be effectively ameliorated. For example, the third sub-pixel may be set as a sub-pixel in a color to which the human eyes are sensitive, such as a green sub-pixel. Each green sub-pixel may be surrounded by a red sub-pixel and a blue sub-pixel, so that the color mixing is more uniform and the color cast is ameliorated. In addition, each sub-pixel structure in the second pixel unit rotates by a predetermined angle and forms mirror symmetry with each sub-pixel structure in the first pixel unit. In addition, a light-transmitting reserved region Z with a large area can be formed between adjacent pixel units as much as possible, which is conducive to increasing a lighting area of the under-screen photosensitive device.

It may be understood that, in some other embodiments, the sub-pixel structures of the first pixel unit and the second pixel unit may also be the same, which is not limited herein. That is, a minimum repetitive unit in the pixel arrangement structure is one pixel unit.

In some embodiments, one pixel unit includes co-sided triangles with non-overlapping areas formed by vertices of respective centers of the first sub-pixels, the second sub-pixels and the third sub-pixels. Specifically, as shown in FIG. 3 and FIG. 4, the first sub-pixel 12 is located on one side of a line c of centers of the two third sub-pixels 16a and 16b, and the second sub-pixel 14 is located on the other side of the line c of centers of the two third sub-pixels 16a and 16b. Centers of the first sub-pixel 12, the third sub-pixel 16 and the second sub-pixel 14 are sequentially connected to form a virtual quadrilateral. Centers of the first sub-pixel 12, one third sub-pixel 16a and the second sub-pixel 14 are connected to form a first triangle. Centers of the first sub-pixel 12, the other third sub-pixel 16b and the second sub-pixel 14 are connected to form a second triangle. The first triangle and the second triangle take a line d from the center of the first sub-pixel 12 to the center of the second sub-pixel 14 as a common side, and the two triangles do not overlap each other in area. In a preferred embodiment, the co-sided triangle is an acute triangle, so that the sub-pixels of the pixel structure are more evenly arranged, which is beneficial to improve the display effect.

A projection of at least one of two end vertices of the common side of the co-sided triangle on an opposite side opposite to the vertex is on the opposite side, and the projection does not coincide with the centers of the two third sub-pixels 16a and 16b. For example, as shown in FIG. 3, the first triangle and the second triangle are co-sided with the line d of centers of the first sub-pixel 12 and the second sub-pixel 14, and a projection of the center of the second sub-pixel 14 (one vertex of the line d of centers) on an opposite side e opposite thereto (a line from the center of the first sub-pixel 12 to the center of one third sub-pixel 16a) is on the opposite side e. Moreover, the projection is located between the center of the first sub-pixel 12 and the center of the third sub-pixel 16a, that is, does not coincide with the center of the third sub-pixel 16a. Correspondingly, a projection of the center of the first sub-pixel 12 (the other vertex of the line d of centers) on an opposite side b opposite thereto (a line of centers of the second sub-pixel 14 and the other third sub-pixel 16b) is on the opposite side b. Moreover, the projection is located between the center of the second sub-pixel 14 and the center of the other third sub-pixel 16*b*, that is, does not coincide with the center of the third sub-pixel 16*b*. As a preferred implementation, a projection of a vertex on the common side of the co-sided triangle on an opposite side of the vertex is near or on a central point of the opposite side. In this way, the sub-pixels are arranged more uniformly, which prevents the color edge phenomenon and helps improve the quality of display.

It is to be noted that the projection of the vertex of the common side on the opposite side refers to a projection of the vertex on the opposite side along a direction perpendicular to the opposite side of the vertex. That is, an intersection point between a perpendicular line passing through the vertex and perpendicular to the opposite side of the vertex and the opposite side is the projection of the vertex on the opposite side. For example, as shown in FIG. 3, one vertex of a common side d of the first triangle and the second triangle is the center of the second sub-pixel 14, and an intersection point between a perpendicular line passing through the center of the second sub-pixel 14 and perpendicular to an opposite side e opposite thereto and the opposite side e is the projection of the vertex on the opposite side opposite thereto.

The center of the third sub-pixel is located on an outer side of a line from the center of the second sub-pixel in the first pixel unit to the center of the second sub-pixel in the second pixel unit adjacent to the first pixel unit. In other words, the center of the third sub-pixel in one pixel unit is located on an outer side of a line from the center of the second sub-pixel in the pixel unit to the center of the second sub-pixel in another pixel unit adjacent thereto. For example, specific to some embodiments, as shown in FIG. 5 and FIG. 6, a line from the center of the second sub-pixel R1 in the first pixel unit to the center of the second sub-pixel R2 in the second pixel unit adjacent to the first pixel unit is staggered with the center of the third sub-pixel G11 and the center of the third sub-pixel G12 in the first pixel unit, and the center of the third sub-pixel G11 and the center of the third sub-pixel G12 are located on two sides of an extension line of the line from the center of the second sub-pixel R1 in the first pixel unit to the center of the second sub-pixel R2 in the second pixel unit adjacent to the first pixel unit. It is to be noted that the center of the sub-pixel being located on an outer side of the line of centers means that the center of the sub-pixel is staggered with the line of centers. That is, the sub-pixel is not on the line of centers. For example, the center of the sub-pixel is located on one side of the line of centers.

As a preferred implementation, the first sub-pixels and the second sub-pixels may be blue sub-pixels and red sub-pixels respectively, and the third sub-pixels may be green sub-pixels. The green sub-pixels each have a smaller light-emitting area than any one of the blue and red sub-pixels. As shown in FIG. 3, in a same pixel unit, a line d from the center of the first sub-pixel 12 to the center of the second sub-pixel 14 and a line c of the centers of the two third sub-pixels 16*a* and 16*b* are not equal in length. It is easy to understand that sub-pixels emitting light in different colors generally have different light-emitting areas. For example, the blue sub-pixels each have larger light-emitting areas than any one of the red sub-pixels and the green sub-pixels. By designing the length of the line d of centers to be equal to that of the line c of centers, the pitch between the first sub-pixel 12 and the second sub-pixel 14 and the pitch between the two third sub-pixels 16*a* and 16*b* can be guaranteed to meet preset conditions to arrange the sub-pixels as close as possible and improve distribution uniformity of the sub-pixels in sensitive colors, which improves visual resolution and enhances the quality of display.

In some embodiments, as shown in FIG. 3 and FIG. 4, in one pixel unit, a length of a line e from the center of the first sub-pixel 12 to the center of one third sub-pixel 16*a* is not equal to a length of a line a from the center of the first sub-pixel 12 to the center of the other third sub-pixel 16*b* in the same pixel unit. Specific to one embodiment, the first sub-pixel 12 is a blue sub-pixel, the third sub-pixels 16*a* and 16*b* are green sub-pixels, and the second sub-pixel 14 is a red sub-pixel. Lengths of lines of centers of the blue sub-pixel and the different green sub-pixels in a same pixel unit are different. In some other embodiments, in one pixel unit, distances between the centers of the two third sub-pixels 16*a* and 16*b* and the center of the second sub-pixel 14 are not equal. In this way, on the one hand, adjacent sub-pixels are less likely to be too close to each other, so as to further prevent visual integration of the two adjacent sub-pixels in the same color by the human eyes caused by difficult distinction between two adjacent sub-pixels in the same color due to a short distance between the adjacent sub-pixels. On the other hand, by setting the lengths of the lines from the centers of the first sub-pixel 12 and the second sub-pixel 14 to the centers of the two third sub-pixels 16*a* and 16*b* to be different, the offset of the sub-pixels is aggravated, so that, when the first pixel unit and the second pixel unit are repeatedly arranged to form a display matrix, arrangement of the sub-pixels in the same color into an individual row can be further prevented, and the protrusion degree of the sub-pixels in the same row or column are weakened, thereby ameliorating the color edge problem of the display edge.

Further, a ratio of distances from the centers of the two third sub-pixels 16*a* and 16*b* to the center of the first sub-pixel 12 is (3 to 2):(2 to 1). A ratio of distances from the centers of the two third sub-pixels 16*a* and 16*b* to the center of the second sub-pixel 14 is also (3 to 2):(2 to 1). It may be understood that, in addition to the color edge and the sense of granularity, resolution and uniformity are also the key factors to affect the quality of display. Therefore, by further limiting the ratios of the distances from the centers of the two third sub-pixels 16*a* and 16*b* to the centers of the first sub-pixel 12 and the second sub-pixel 14, the arrangement of the sub-pixels achieves a good balance between uniformity, compactness and offset degrees, thereby improving the quality of display comprehensively.

It is to be noted that the center of the sub-pixel may be a geometric center of a graphic of the sub-pixel or a center of a light-emitting color of the sub-pixel, which is not limited herein.

In some embodiments, centers of the first sub-pixels and the second sub-pixels in the same first pixel row are not on a same straight line. For example, as shown in FIG. 6, a line of centers of the first sub-pixels B1/B2 in the same first pixel row is a first straight line LL1, and a line of centers of the second sub-pixels R1/R2 in the same pixel row is a second straight line LL2. The first straight line and the second straight line are not collinear with each other, so that the sub-pixels can be offset while being arranged as close as possible, thereby effectively improving the distribution uniformity of the sub-pixels in sensitive colors and enhancing the quality of display. As a preferred implementation, the first straight line LL1 and the second straight line LL2 are parallel to each other, so that the sub-pixels are arranged more evenly, so as to further improve the quality of display.

In some embodiments, along the pixel row or column direction, centers of the third sub-pixels in the same second pixel row are not on a same straight line. For example, as shown in FIG. 6, a line of centers of the third sub-pixels in the same second pixel row may have a regular zigzag or wavy shape. In this way, on the premise of satisfying the offset arrangement of the sub-pixels in the pixel unit, the green sub-pixels in the adjacent pixel group are less likely to be too close to each other, so as to further prevent visual integration of the two adjacent green sub-pixels by the human eyes caused by difficult distinction between two adjacent green sub-pixels due to a short distance between the adjacent green sub-pixels.

In an example, the third sub-pixels and the second sub-pixels may be regular graphics or irregular graphics with major axes and minor axes, for example, one of an ellipse, a circle, a sector, a dumbbell, a pear, a rectangle, a quasi-rectangle, a rounded rectangle, a star, and a heart. As shown in FIG. 3 and FIG. 4, as a preferred implementation, the second sub-pixel 14 and the third sub-pixels 16a and 16b may be in the shape of a rectangle or quasi-rectangle, and major-axis directions (extension directions) of the second sub-pixel 14 and the third sub-pixels 16a and 16b intersect a horizontal row direction and a vertical column direction. In this way, on the one hand, compared with other sub-pixel shapes, the sub-pixels can be arranged densely, and the arrangement of the sub-pixels in the same color into an individual row is prevented, which effectively ameliorates the color edge phenomenon. On the other hand, the sub-pixels at irregular edges of the display panel can better match the rounded corner design, that is, the tilt of the sub-pixels is tangent to or consistent with the radian of the rounded corner, so as to realize the smooth transition of the edges of the sub-pixels at the rounded corner, thereby alleviating the problem of serration at the rounded corner. Preferably, the first sub-pixels 12 have first edges parallel to the first direction and second edges parallel to the second direction; preferably, the first sub-pixels are in the shape of a diamond or square. Preferably, extension directions of the second sub-pixel 14 and the third sub-pixels 16a and 16b are parallel to the first direction or the second direction, for example, at an angle of 30°-60° to the horizontal row direction or the vertical column direction. In this way, the tilt of the sub-pixels can be further tangent to or consistent with the radian of the rounded corner, so as to realize the smooth transition of the edges of the sub-pixels at the rounded corner, thereby further alleviating the problem of serration at the rounded corner. It is to be emphasized that the human eyes are sensitive to the quality of pictures in the horizontal or vertical direction, but insensitive to the quality of pictures in a direction at an angle of 45° to the horizontal direction. Therefore, as a preferred implementation, as shown in FIG. 7, an angle between the first direction and the horizontal row direction is 45°, so as to further improve the overall quality of display. It is to be particularly noted that, the force on the mask is generally transferred along the row or column direction. For example, net tensile force F is transferred along the row direction, and the opening of the mask of the corresponding sub-pixel tilting relative to the row or column direction may decompose the force in the row direction and the column direction, so as to prevent deformation of the opening caused by concentration of the net tensile force F of the FMM and reduce the manufacturing difficulty and the net tension difficulty of the mask. Moreover, with the tilt of the opening of the mask, more openings may be provided in the mask with the same length and width, thereby reducing manufacturing costs of the mask.

Certainly, the first sub-pixels, the third sub-pixels and the second sub-pixels may also be in other shapes, which is not limited herein. For example, the first sub-pixels may be in the shape of a diamond or square, and the third sub-pixels and the second sub-pixels are in the shape of an oblong.

It is to be noted that the quasi-rectangle means that due to technical limitations or for the convenience of mask manufacturing, the shape of the sub-pixels may not be strictly rectangular, but roughly rectangular, for example, a rounded rectangle with rounded corners or a chamfered rectangle. The rounded rectangle is a shape formed when top corners of a rectangle are rounded. The chamfered rectangle is a shape formed when one or more of the top corners of a rectangle is/are cut off. By setting the shape of the sub-pixel as a quasi-rectangle, an aperture ratio of the sub-pixel can be adjusted more flexibly, and restrictions on the manufacturing of the mask can be met.

Further, along the first direction, the second sub-pixels whose major-axis directions are parallel to the first direction and the third sub-pixels whose major-axis directions are parallel to the first direction are not in a same row (projections not overlap); and/or along the second direction, the second sub-pixels whose major-axis directions are parallel to the second direction and the third sub-pixels whose major-axis directions are parallel to the second direction are not in a same row (projections not overlap). For example, as shown in FIG. 5, along the first direction, the second sub-pixel R2 whose major-axis direction is parallel to the first direction and the third sub-pixel G21 whose major-axis direction is parallel to the first direction are staggered with each other and not in a same row. Along the second direction, the second sub-pixel R1 whose major axis is parallel to the second direction and the third sub-pixel G11 whose major axis is parallel to the second direction are staggered with each other and not in a same row. Correspondingly, in some embodiments, along the first direction, the second sub-pixels whose major-axis directions are parallel to the first direction and any of the first sub-pixels are not in a same row (projections not overlap); and/or along the second direction, the second sub-pixels whose major-axis directions are parallel to the second direction and any of the first sub-pixels are not in a same row (projections not overlap). In this way, the sub-pixels can be offset while being arranged as close as possible, thereby effectively ameliorating the color cast, improving the distribution uniformity of the sub-pixels in sensitive colors and enhancing the quality of display.

In some embodiments, any two adjacent third sub-pixels have different major-axis directions in a same second pixel row. Preferably, along the first direction and the second direction, two adjacent second sub-pixels arranged in a same row have different major-axis directions. For example, as shown in FIG. 5, the first direction and the second direction are directions tilting with respect to the horizontal row direction and the vertical column direction. Along the first direction and the second direction, major-axis directions of two adjacent third sub-pixels, G12 and G21, and G11 and G22, arranged in the same row are opposite to each other. In other words, since the structure of the sub-pixels in the second pixel unit rotating by a predetermined angle forms mirror symmetry with that of the sub-pixels in the first pixel unit, two adjacent third sub-pixels arranged along the first direction and the second direction have different major-axis directions. In this way, on the one hand, the offset arrangement of the sub-pixels is aggravated while the sub-pixels are arranged as close as possible, which effectively ameliorates the color cast. On the other hand, the sense of granularity caused by identification as one by the human eyes due to an excessively short distance between the sub-pixels in the same color is prevented.

In some embodiments, in the first direction, the first pixel unit and the second pixel unit adjacent thereto form a first pixel group. In the second direction, the first pixel unit and the second pixel unit adjacent thereto form a second pixel group. In other words, in the first direction, one first pixel unit and one second pixel unit form a first pixel group; in the second direction, one first pixel unit and one second pixel unit form a second pixel group. Specific to the embodiments shown in FIG. 5 and FIG. 6, taking a pixel unit as a unit, two first pixel units and two second pixel units form a repetitive unit, and the two second pixel units are located on two sides of a line of geometric centers of the two first pixel units, respectively. Taking a pixel group as a unit, two first pixel groups in different rows or two second pixel groups in different columns form a repetitive unit. A plurality of repetitive units are arranged in the first direction and the second direction. The center of the third sub-pixel in the first pixel group is located on an outer side of a line of centers of the two second sub-pixels in the first pixel group; and/or the center of the third sub-pixel in the second pixel group is located on an outer side of a line of centers of the two second sub-pixels in the second pixel group. For example, as shown in FIG. 5, the center of the third sub-pixel G11/G12/G21/G22 in the first pixel group is located on an outer side of a line of centers of the two second sub-pixels R1/R2 in the first pixel group. The center of the third sub-pixel in the second pixel group is located on an outer side of a line of centers of the two second sub-pixels R1/R2 in the second pixel group. In this way, on the premise of ensuring the arrangement of the sub-pixels as uniform as possible, the sub-pixels can be offset, so that, when the repetitive units are repeatedly arranged to form a display matrix, arrangement of the sub-pixels in the same color into an individual row can be further prevented, and protrusion degrees of the sub-pixels in the same row or column are weakened, thereby ameliorating the color edge problem of the display edge. It is to be noted that the SPR technology is used so as to improve the resolution, and in order to achieve full color display, there is a need to borrow colors that cannot be displayed from neighboring sub-pixels. Therefore, the uniform arrangement of the sub-pixels means that the distances between the sub-pixels are within a reasonable range, so as to prevent a poor display effect caused by excessively short and close distances between sub-pixels in some regions of the pixel arrangement structure and excessively long and loose distances between sub-pixels in some regions.

It may be understood that, with the application of a notch screen or hole screen technology, the sense of serration of an irregular edge region (such as a curved region) is also a factor to affect the quality of display. The applicant of the present application has found from study that the sub-pixels in different rows form a stepped shape along the extension direction of the irregular edge region, thereby aggravating the sense of serration of images at the irregular region when the display panel displays the images, which affects the display effect of the display panel. Therefore, as an embodiment, a plurality of repetitive units may be arranged along the first direction and the second direction obliquely intersecting with the horizontal row direction and the vertical column direction. With the repeated arrangement of the repetitive units, a line of edges of a plurality of sub-pixels located at irregular edges of a display region tend to coincide with or be parallel to tangent lines of the irregular edges, so that the line of the edges of the plurality of sub-pixels are more smooth and close to the shape of the irregular edges, thereby ameliorating the sense of serration of images at the irregular edges and helping improve the display effect of the display panel. In addition, the sub-pixels located at the irregular edges of the display region may also include a plurality of colors, so as to further ameliorate the color edges formed at the irregular edges of the display panel, thereby improving the display effect of the display panel. Preferably, the first direction and the second direction are perpendicular to each other, and an angle between the first direction and the row direction is 30°-60°, preferably 45°.

Further, in a same pixel unit, along the first direction and the second direction, a minimum distance between two adjacent sub-pixels is n, and along the first direction and the second direction, a minimum distance between the nearest sub-pixels in different colors in two adjacent pixel units is also n. 10 μm<n<30 μm. In this way, on the one hand, the sub-pixels are arranged more evenly, which is conducive to improving the quality of display; on the other hand, the sense of serration produced by light-emitting crosstalk of color or interference between adjacent sub-pixels can be effectively prevented. It is to be noted that the display panel according to the embodiment of the present application may be an organic light-emitting display panel, the sub-pixel includes at least an anode, a cathode, and a light-emitting layer between the anode and the cathode, and the driving circuit applies a voltage between the anode and the cathode to excite the migration of carriers and act on the light-emitting layer for emitting light. The display panel may further include a pixel definition layer. The pixel definition layer defines a plurality of pixel openings. The light-emitting layer of the sub-pixel is arranged in the pixel openings to prevent crosstalk of color or interference between adjacent sub-pixels. Therefore, an area of the pixel opening is a light-emitting area of the sub-pixel. However, due to the limitations of the vapor deposition technology, in order to ensure that the light-emitting material is completely vapor-deposited into the pixel opening, an opening area of the mask is generally larger than that of the pixel opening, so as to leave a vapor deposition margin. For example, as shown in FIG. 3, an inner side edge of the sub-pixel is called a pixel edge, which is a boundary of the pixel opening of the pixel definition layer (PDL). An outer side edge is called a virtual edge of the sub-pixel. The virtual edge is a boundary of a vapor deposition opening of the mask. Thus, in the embodiment of the present application, the pitch between the sub-pixels refers to a distance between pixel edges of two sub-pixels. Specific to the embodiments shown in FIG. 3 and FIG. 4, if two adjacent sub-pixels have two pixel edges adjacent and parallel to each other, a minimum distance between the two adjacent sub-pixels is a vertical distance between the two pixel edges adjacent and parallel to each other.

Further, a minimum distance between the third sub-pixels 16*a* and 16*b* in the first pixel unit and the second sub-pixel 14 of the second pixel unit adjacently arranged in the first direction is p, where b<p<3b. In this way, the light-transmitting reserved region can be ensured to have an enough size to meet the amount of light input required for the normal operation of the under-screen photosensitive device.

In some embodiments of the present application, a projection of at least one vertex on a common side of the co-sided triangle on an opposite side of the vertex, as a whole, is located between intersection points of contours of two sub-pixels corresponding to the opposite side and the opposite side. In other words, an intersection point between a straight line passing through a vertex on a common side of the co-sided triangle and perpendicular to an opposite side of the vertex is located between intersection points of contours of two sub-pixels corresponding to the opposite side of the vertex and the opposite side of the vertex. Further, a projection of a sub-pixel corresponding to at least one vertex on a common side of the co-sided triangle on an opposite side of the vertex, as a whole, is located between intersection points of contours of two sub-pixels corresponding to the opposite side of the vertex and the opposite side of the vertex. Specific to some embodiments, as shown in FIG. 3 and FIG. 4, two vertices of the common side are the center of the first sub-pixel 12 and the center of the second sub-pixel 14, respectively. To enable the arrangement of the sub-pixels to be more uniform and reduce the manufacturing difficulty, two adjacent sub-pixels have two pixel edges that are opposite and parallel to each other. For example, the first sub-pixel 12 and the third sub-pixel 16a have two pixel edges that are opposite and parallel to each other. The two pixel edges are contour boundaries of the first sub-pixel 12 and the third sub-pixel 16a. A projection of the second sub-pixel 14 towards the opposite side e, as a whole, is located between intersection points of the opposite side e and the contours of the first sub-pixel 12 and the third sub-pixel 16a. That is, the projection of the second sub-pixel 14 towards the opposite side e is located between intersection points of the opposite side e and the two pixel edges that are opposite and parallel to each other of the first sub-pixel 12 and the third sub-pixel 16a. It may be understood that, in the embodiment shown in FIG. 3, the projection of the first sub-pixel 12 towards the opposite side b, as a whole, is not located between the opposite side b and the line of centers of the other third sub-pixel 16b and the second sub-pixel 14, which does not hinder the understanding of the technical concept. In some other embodiments, the projection of the first sub-pixel 12 towards the opposite side b, as a whole, may be located between intersection points of the opposite side b and two pixel edges that are opposite and parallel to each other of the other third sub-pixel 16b and the second sub-pixel 14. In this way, on the one hand, the sub-pixels are arranged more uniformly, and on the other hand, the offset arrangement of the sub-pixels further ameliorates the color edge phenomenon.

In some embodiments, in a same pixel unit, the first sub-pixel has a first major axis and a first minor axis; the second sub-pixel has a second major axis and a second minor axis; and the third sub-pixel has a third major axis and a third minor axis. That is, each sub-pixel is a regular or irregular graphic with a major axis and a minor axis, such as a rectangle or a quasi-rectangle. In this way, on the one hand, compared with other sub-pixel shapes, the sub-pixels can be offset densely, and protrusion degrees of the sub-pixels are weakened, which effectively ameliorates the color edge phenomenon. Further, a ratio of the first major axis to the first minor axis is between 1.5 and 1; a ratio of the second major axis to the second minor axis is between 5 and 1; and a ratio of the third major axis to the third minor axis is between 5 and 1. For example, in the embodiments shown in FIG. 3 and FIG. 4, the first sub-pixel 12 is in the shape of a square, and the ratio of the first major axis to the first minor axis is 1; the third sub-pixel 16a and the second sub-pixel 14 are both in the shape of an oblong, and ratios of the major axes to the minor axes of the third sub-pixel 16a and the second sub-pixel 14 are 5:1. In this way, on the premise of ensuring the aperture ratio as much as possible, the sub-pixels can be offset correspondingly to ameliorate the color edge phenomenon as much as possible. In addition, a light-transmitting reserved region with a larger area can also be formed between adjacent sub-pixels as much as possible to increase a light-receiving area of the under-screen photosensitive device.

It is to be noted that the length of the major axis of the sub-pixel refers to a maximum size of the light-emitting region of the sub-pixel in a longitudinal extension direction, and the length of the minor axis of the sub-pixel refers to a maximum size of the light-emitting region of the sub-pixel in a width direction opposite to the longitudinal extension direction of the light-emitting region.

In some embodiments, along the first direction or the second direction, center points of the first sub-pixels arranged in a same direction are not on a same straight line. The centers of the first sub-pixels may be reasonably adjusted according to pitches with adjacent pixels, so as to achieve a better overall layout and improve space utilization.

In some embodiments, the third sub-pixels are regular graphics or irregular graphics with major axes and minor axes; and two first sub-pixels are provided each of the third sub-pixels has on both sides of major-axis direction of each of the third sub-pixels or on both sides of minor-axis direction each of the third sub-pixels. As shown in FIG. 5, when the two first sub-pixels are located on the two sides of the major-axis direction of the third sub-pixel, a pitch therebetween is d1; and when the two first sub-pixels are located on the two sides of the minor-axis direction of the third sub-pixel, a pitch therebetween is d2, and d1 is greater than d2. The centers of the first sub-pixels may be reasonably adjusted according to pitches with adjacent pixels, so as to achieve a better overall layout and improve space utilization.

In some embodiments, in the first pixel unit and the second pixel unit adjacent to each other in the first direction, the distance between the second sub-pixel R1 in the first pixel unit and the third sub-pixel G21 in the second pixel unit is greater than the distances between the two third sub-pixels G11 and G12 and the second sub-pixel R1 in the first pixel unit. This further ensures that a continuous light-transmitting reserved region Z with an area that can meet the normal operation of the under-screen photosensitive device may be formed in each repetitive unit, so as to improve the light transmittance of the display panel, providing convenience for the diversification of functions of the display panel. As an implementation, an area of the light-transmitting reserved region Z is greater than the light-emitting area of one first sub-pixel R1/R2.

Specific to one embodiment, in the first pixel unit or the second pixel unit, the first sub-pixel is in the shape of a square or quasi-square, the second sub-pixel may be in the shape of a rectangle or quasi-rectangle, and the two third sub-pixel are in the shape of a rectangle or quasi-rectangle. In this way, the sub-pixels may be offset while the sub-pixels are arranged densely, thereby effectively ameliorating the color edge. It is to be noted that the quasi-rectangle or quasi-square means that due to technical limitations or for the convenience of mask manufacturing, the shape of the sub-pixels may not be strictly rectangular or square, but roughly rectangular or square, for example, a rounded rectangle with rounded corners or a chamfer rectangle. The rounded rectangle is a shape formed when top corners of a rectangle are rounded. The chamfer rectangle is a shape formed when one or more of the top corners of a rectangle is/are cut off. By setting the shape of the sub-pixel as a quasi-rectangle or quasi-square, an aperture ratio of the sub-pixel can be adjusted more flexibly, and restrictions on the manufacturing of the mask can be met.

In some embodiments, in the first pixel unit or the second pixel unit, light-emitting areas of two third sub-pixels are equal. For example, the two third sub-pixels may be set as the sub-pixels in a color to which the human eyes are sensitive, so that the resolution can be as high as possible while the display is more uniform. Further, the light-emitting areas of the second sub-pixel and the third sub-pixel may also be equal. In this way, the arrangement of the sub-pixels is more compact and uniform as a whole, and the display effect is improved. Specific to some embodiments, in a same pixel unit, the first sub-pixel has a first major axis and a first minor axis; the second sub-pixel has a second major axis and a second minor axis; and the third sub-pixel has a third major axis and a third minor axis. That is, each sub-pixel is a regular or irregular graphic with a major axis and a minor axis, such as a rectangle or a quasi-rectangle. Two third sub-pixels are sub-pixels in the same color, such as green sub-pixels. The third major axes of the two third sub-pixels are parallel to each other and have equal lengths, and the third minor axes of the two third sub-pixels are parallel to each other and have equal lengths, so that the light-emitting areas of the two third sub-pixels are equal.

In some embodiments, a long edge of the second sub-pixel 14 is parallel to a set of opposite edges of the first sub-pixel 12, a long edge of the third sub-pixel 16a, and a long edge of the third sub-pixel 16b. It may be understood that the first sub-pixel is in the shape of a square or quasi-square, so a set of opposite edges opposite to each other are parallel to each other and have equal lengths, while the third sub-pixel is a rectangle or quasi-rectangle, so it has a set of long edges parallel to each other and a set of short edges parallel to each other. For example, as shown in FIG. 3, the first sub-pixel 12 has a first edge and a second edge opposite to the third sub-pixel 16a and the third sub-pixel 16b respectively, a third edge adjacent to the first edge and opposite to the second edge, and a fourth edge opposite to the first edge and connected to the second edge and the third edge. The first edge and the fourth edge of the first sub-pixel 12 are parallel to the long edge of the second sub-pixel 14, and are parallel to the long edges of the third sub-pixel 16a and the third sub-pixel 16b. This helps arrange the sub-pixels uniformly, thereby improving the quality of display.

In some embodiments, in the first pixel unit, an extension line of one edge of the first sub-pixel 12 near an edge of the first pixel unit coincides with an extension line of a short edge of the third sub-pixel 16a near the same edge of the first pixel unit. An extension line of the other edge of the first sub-pixel 12 near an edge of the first pixel unit coincides with an extension line of a long edge of the third sub-pixel 16b near the same edge of the first pixel unit. Specific to an embodiment, in one pixel unit, the third edge of the first sub-pixel 12 may be collinear with the short edge of the third sub-pixel 16a, and the fourth edge of the first sub-pixel 12 may be collinear with the long edge of the third sub-pixel 16b. In this way, the pixel units are ensured to have a regular shape as much as possible, so that the arrangement of sub-pixels is more compact and uniform.

In some embodiments, as shown in FIG. 3 and FIG. 4, an extension line of the second edge of the first sub-pixel 12 is staggered with the third sub-pixel 16a, and an extension line of the first edge is staggered with the third sub-pixel 16b. In this way, degrees of offset between the sub-pixels are ensured, protrusion degrees of the sub-pixels of the display edge are weakened, and the color edge problem of the display edge is effectively ameliorated.

In some embodiments, lengths of the long edges of the second sub-pixel and the third sub-pixel may be equal to the length of the edge of the first sub-pixel. In this way, the pixel units are further ensured to have a regular shape, so that the arrangement of sub-pixels is more compact and uniform.

In some embodiments, the extension line of at least one of the two long edges of the second sub-pixel 14 passes through a gap between the first sub-pixel 12 and the third sub-pixel 16a. Further, the extension line of one long edge of the second sub-pixel 14 passes through the gap between the first sub-pixel 12 and the third sub-pixel 16a, and the extension line of the other long edge of the second sub-pixel 14 coincides with the edge of the first sub-pixel 12 close to the third sub-pixel 16a. For example, as shown in FIG. 3 and FIG. 4, the extension line of one long edge of the second sub-pixel 14 passes between the first sub-pixel 12 and the third sub-pixel 16a. The extension line of the other long edge of the second sub-pixel 14 is collinear with the first edge of the first sub-pixel. In this way, on the premise of uniform arrangement of the sub-pixels, the size of the light-transmitting reserved region is guaranteed as much as possible, which is conducive to the realization of, for example, functions of the under-screen camera. Certainly, in some other embodiments, the extension lines of the two long edges of the second sub-pixel 14 pass through the gap between the first sub-pixel 12 and the third sub-pixel 16a. That is, if the second sub-pixel 14 is translated along the first direction, it can pass between the first sub-pixel 12 and the third sub-pixel 16a.

In some embodiments, as shown in FIG. 7, the pixel arrangement structure includes a virtual polygon formed by four virtual quadrilaterals arranged with shared sides. The four virtual quadrilaterals specifically include a first virtual quadrilateral 30, a second virtual quadrilateral 40, a third virtual quadrilateral 50 and a fourth virtual quadrilateral 60. The first virtual quadrilateral 30 shares a first shared side g with the third virtual quadrilateral 50 along the row direction, and shares a second shared side h with the second virtual quadrilateral 40 in the column direction. The fourth virtual quadrilateral 60 shares a third shared side j with the third virtual quadrilateral 50 along the column direction, and shares a fourth shared side i with the second virtual quadrilateral 40 in the row direction. Sides of the first virtual quadrilateral 30, the second virtual quadrilateral 40, the third virtual quadrilateral 50 and the fourth virtual quadrilateral 60 away from the shared sides form sides of the virtual quadrilaterals. The second sub-pixel 14 is located at a position of a first vertex of each virtual quadrilateral, the first sub-pixel 12 is located at a position of a second vertex of each virtual quadrilateral, the first vertex and the second vertex are alternately arranged and spaced, and the third sub-pixel 16a/16b is located in each virtual quadrilateral.

Further, any side of each of the virtual quadrilaterals is not parallel to the row or column direction; or any two sides of each of the virtual quadrilaterals are not equal in length; or any two sides of each of the virtual quadrilaterals are not parallel to each other; or any two inner angles of each of the virtual quadrilaterals are not equal. In this way, the first virtual quadrilateral, the second virtual quadrilateral, the third virtual quadrilateral and the fourth virtual quadrilateral are all irregular quadrilaterals, so that a large light-transmitting region may be formed on the premise of meeting compact arrangement of the sub-pixels, thereby further improving the light transmittance of the display panel and providing the convenience for the diversification of functions of the display panel.

In some embodiments, as shown in FIG. 3 and FIG. 4, in one pixel unit, the second sub-pixel 14 has a first edge and a second edge opposite to the two third sub-pixel 16a and the third sub-pixel 16b respectively, a third edge adjacent to the first edge and opposite to the second edge, and a fourth edge opposite to the first edge and connected to the second edge and the third edge. Extension lines of the second edge and the fourth edge are staggered with the third sub-pixel 16a, and extension lines of the first edge and the fourth edge are staggered with the third sub-pixel 16b. That is, the third sub-pixels 16a and 16b are located between extension lines of corresponding edges of the second sub-pixels. In this way, compact arrangement of the sub-pixels is ensured as much as possible, protrusion degrees of the sub-pixels of the display edge are weakened, and the color edge problem of the display edge is effectively ameliorated.

In some embodiments, a line of centers of four adjacent third sub-pixels forms a virtual quadrilateral, and a minimum inner angle of the virtual quadrilateral is greater than 60° and less than 90°. In this way, on the one hand, distances between four third sub-pixels G11, G12, G21 and G22 are limited by controlling the minimum angle, thereby preventing uneven display caused by excessively long distances. On the other hand, green sub-pixels in adjacent pixel groups should not be too close, so as to further prevent visual integration of the two adjacent green sub-pixels by the human eyes caused by difficult distinction between two adjacent green sub-pixels due to a short distance between the adjacent green sub-pixels.

Based on the same application concept, the present application further provides a mask configured to manufacture the pixel arrangement structure according to the embodiment of the present application. The mask includes a plurality of opening regions. The opening regions correspond to shapes and positions of the first sub-pixel 12, the second sub-pixel 14 and the third sub-pixels 16a and 16b.

Based on the same application concept, the present application further provides a display device. The display device includes the display panel 100 in the above embodiment.

Specifically, the display device may be applied to fields such as mobile phone terminals, bionic electronics, electronic skin, wearable devices, vehicle-mounted devices, Internet of Things devices and artificial intelligence devices. For example, the display device may be a digital device such as a mobile phone, a tablet computer, a handheld computer, an iPod, or a smart watch.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, and their description is specific and detailed, but cannot therefore be understood as a limitation on the patent scope of the application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A display panel, wherein the display panel comprises a plurality of sub-pixels and a plurality of light-transmitting reserved regions, the plurality of sub-pixels comprising a plurality of first sub-pixels, a plurality of second sub-pixels, and a plurality of third sub-pixels, wherein one of the second sub-pixels and one of the light-transmitting reserved regions are adjacently arranged to form a combined region;
   wherein the display panel comprises a plurality of first pixel rows and a plurality of second pixel rows, the first pixel rows and the second pixel rows being alternately arranged;
   wherein a plurality of first sub-pixels and a plurality of combined regions are arranged in each of the first pixel rows, the first sub-pixels and the combined regions are alternately arranged in the first pixel row, and a plurality of third sub-pixels are arranged in each of the second pixel rows; and
   wherein, in two adjacent first pixel rows, a pixel arrangement of a combined region located in one first pixel row and another pixel arrangement of a combined region located in another first pixel row are different, and have the same structures if one of the two combined regions is rotated by 90 degrees.

2. The display panel according to claim 1, wherein the first sub-pixels located in the two adjacent first pixel rows are offset along an extension direction of the first pixel row.

3. The display panel according to claim 2, wherein two first sub-pixels respectively located in different first pixel rows and adjacent to each other are arranged in a first direction or a second direction;
   wherein each of the third sub-pixels is arranged between two first sub-pixels in the first direction or the second direction; and
   wherein the first direction and the second direction are perpendicular to each other and intersect with the extension directions of the first pixel rows, respectively.

4. The display panel according to claim 3, wherein, along the first direction or the second direction, center points of the first sub-pixels arranged in a same direction are not on a same straight line.

5. The display panel according to claim 3, wherein the pixel arrangement structure comprises a plurality of first pixel units and a plurality of second pixel units, the first pixel units and the second pixel units are alternately arranged in the first direction or the second direction, and a mirror structure of the second pixel units rotating by 90 degrees as a whole is same as that of the first pixel units; and
   wherein the first pixel unit or the second pixel unit comprises one of the first sub-pixels, two of the second sub-pixels, and one of the combined regions; wherein along the first direction or the second direction, the first sub-pixel and one of the third sub-pixels are in a same row, and another third sub-pixel and the combined region are in another row.

6. The display panel according to claim 5, wherein, in the other row, the second sub-pixel is located between the other third sub-pixel and the light-transmitting reserved region.

7. The display panel according to claim 6, wherein the second sub-pixels and the third sub-pixels have same major-axis directions in a same pixel unit.

8. The display panel according to claim 1, wherein centers of the first sub-pixels and centers of the second sub-pixels in a same first pixel row are not on a same straight line.

9. The display panel according to claim 8, wherein
   the centers of the first sub-pixels in the same first pixel row are located on a first straight line, the centers of the second sub-pixels in the same first pixel row are located on a second straight line, and the first straight line and the second straight line are not collinear with each other.

10. The display panel according to claim 9, wherein the first straight line is parallel to the second straight line.

11. The display panel according to claim 1, wherein centers of the third sub-pixels in a same second pixel row are not on a same straight line.

12. The display panel according to claim 11, wherein a line of the centers of the third sub-pixels in the same second pixel row has a regular wavy shape.

13. The display panel according to claim 1, wherein the second sub-pixels and the third sub-pixels are regular graphics or irregular graphics with major axes and minor axes;
wherein major-axis directions of the second sub-pixels are parallel to the first direction or the second direction; or
wherein major-axis directions of the third sub-pixels are parallel to the first direction or the second direction.

14. The display panel according to claim 13, wherein the first sub-pixels have first edges parallel to the first direction and second edges parallel to the second direction; or
wherein the first sub-pixels are in a shape of a diamond or square; or
wherein the second sub-pixels and the third sub-pixels are in a shape of a rectangle or quasi-rectangle.

15. The display panel according to claim 13, wherein along the first direction, second sub-pixels whose major-axis directions are parallel to the first direction and third sub-pixels whose major-axis directions are parallel to the first direction are not in a same row; or
wherein along the second direction, second sub-pixels whose major-axis directions are parallel to the second direction and third sub-pixels whose major-axis directions are parallel to the second direction are not in a same row.

16. The display panel according to claim 13, wherein along the first direction, second sub-pixels whose major-axis directions are parallel to the first direction and any of the first sub-pixels are not in a same row; or
wherein along the second direction, second sub-pixels whose major-axis directions are parallel to the second direction and any of the first sub-pixels are not in a same row.

17. The display panel according to claim 14, wherein any two adjacent third sub-pixels have different major-axis directions in a same second pixel row.

18. The display panel according to claim 1, wherein a line of centers of four adjacent third sub-pixels forms a virtual quadrilateral, and a minimum inner angle of the virtual quadrilateral is greater than 60° and less than 90°.

19. The display panel according to claim 1, wherein the third sub-pixels are regular graphics or irregular graphics with major axes and minor axes; and
wherein each of the third sub-pixels has two first sub-pixels along two sides of its major-axis direction or along two sides of its minor-axis direction, wherein, when the two first sub-pixels are located on the two sides of the major-axis direction of the third sub-pixel, a pitch therebetween is d1; and when the two first sub-pixels are located on the two sides of the minor-axis direction of the third sub-pixel, a pitch therebetween is d2, wherein d1 is greater than d2.

20. A display device, comprising the display panel according to claim 1.

* * * * *